US011670611B2

(12) United States Patent
Chang-Chien et al.

(10) Patent No.: US 11,670,611 B2
(45) Date of Patent: Jun. 6, 2023

(54) SEMICONDUCTOR PACKAGE COMPRISING PLURALITY OF BUMPS AND FABRICATING METHOD

(71) Applicant: Powertech Technology Inc., Hukou Township, Hsinchu County (TW)

(72) Inventors: Shang-Yu Chang-Chien, Hukou Township, Hsinchu County (TW); Hung-Hsin Hsu, Hukou Township, Hsinchu County (TW); Nan-Chun Lin, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 0 days.

(21) Appl. No.: 17/392,369

(22) Filed: Aug. 3, 2021

(65) Prior Publication Data

US 2022/0302061 A1 Sep. 22, 2022

(30) Foreign Application Priority Data

Mar. 16, 2021 (TW) ................................ 110109427

(51) Int. Cl.

| | |
|---|---|
| ***H01L 23/00*** | (2006.01) |
| ***H01L 23/488*** | (2006.01) |
| ***H01L 21/56*** | (2006.01) |
| ***H01L 21/463*** | (2006.01) |
| ***H01L 23/31*** | (2006.01) |

(52) U.S. Cl.

CPC ............ *H01L 24/14* (2013.01); *H01L 21/463* (2013.01); *H01L 21/56* (2013.01); *H01L 23/31* (2013.01); *H01L 23/488* (2013.01); *H01L 24/11* (2013.01)

(58) Field of Classification Search

CPC ......... H01L 24/14; H01L 24/11; H01L 21/56; H01L 23/31; H01L 23/488

USPC ........................................................ 257/738

See application file for complete search history.

(56) References Cited

U.S. PATENT DOCUMENTS

| | | | | |
|---|---|---|---|---|
| 2013/0334683 A1 | 12/2013 | Kim et al. | |
| 2018/0076157 A1* | 3/2018 | Hsu | H01L 24/17 |
| 2018/0190594 A1* | 7/2018 | Hsu | H01L 24/19 |
| 2019/0109118 A1 | 4/2019 | Yu et al. | |
| 2020/0203299 A1 | 6/2020 | Huang et al. | |
| 2020/0243461 A1 | 7/2020 | Chiang et al. | |

* cited by examiner

*Primary Examiner* — Didarul A Mazumder

(74) *Attorney, Agent, or Firm* — Patenttm.US

(57) ABSTRACT

A semiconductor package comprising plurality of bumps and fabricating method thereof. The package has a chip, a plurality of first and second bumps, an encapsulation, a redistribution. The chip has a plurality of pads and an active area and the active surface has a first area and a second area surrounding the first, the pads formed on a first area of the active surface, each first bump formed on the corresponding pad. The second bumps are formed on the second area, each second bump has first and second different width layers. The encapsulation encapsulates the chip and bumps and is ground to expose the bumps therefrom. During grinding, all of the first bumps are completely exposed by determining a width of an exposed surface of the second bump to electrically connect to the redistribution is increased. Therefore, a shallow-grinding or over-grinding does not occur.

11 Claims, 12 Drawing Sheets

300
200'
10
31
40

1a
10
40
30
20

SEMICONDUCTOR PACKAGE COMPRISING PLURALITY OF BUMPS AND FABRICATING METHOD

CROSS-REFERENCE TO RELATED APPLICATIONS

This application is based upon and claims priority under 35 U.S.C. 119 from Taiwan Patent Application No. 110109427 filed on Mar. 16, 2021, which is hereby specifically incorporated herein by this reference thereto.

BACKGROUND OF THE INVENTION

1. Field of the Invention

The present invention relates to a semiconductor package comprising plurality of bumps and fabricating method thereof, and more particularly to a chip-first type semiconductor package and fabricating method thereof.

2. Description of the Prior Arts

The chip-first type semiconductor package is one of a plurality of wafer level packages. With reference to FIG. 7A, in a fabricating method of the chip-first type semiconductor package, a plurality of pads 82 are formed on an active surface 81 of a chip 80 and a plurality of metal bumps 83 are respectively formed on the pads 82. Then, the chip 80 with the pads 82 and the metal bumps 83 are encapsulated by an encapsulation 90. The encapsulation 90 is ground to expose the metal bumps 83 and a step of forming a redistribution layer is proceeded after then.

In the grinding step, a grinding depth of the encapsulation is not easily controlled. As shown in FIG. 7A, the grinding depth of the encapsulation 90 is shallow, so some of the metal bumps 83 are exposed from the encapsulation 90 and the rest of the metal bumps 83*a* are still encapsulated therein. On the contrary, as shown in FIG. 7B, the grinding depth of the encapsulation is too deep, so the metal bump 83*b* is too thin or even disappears and only the pad 82 on the chip 80 are left.

To overcome the shortcomings, the present invention provides a new chip-first type semiconductor package and fabricating method thereof to mitigate or to obviate the aforementioned problems.

SUMMARY OF THE INVENTION

An objective of the present invention is to provide a semiconductor package comprising plurality of bumps and fabricating method thereof.

To achieve the objective as mentioned above, the semiconductor package having:

a chip having a plurality of pads and an active surface having a first area and a second area, wherein the second area surrounds the first area and the pads are formed on the first areas;

a plurality of first bumps respectively formed on pads on the first area, wherein each first bump has a first surface departed away from the corresponding pad;

a plurality of second bumps formed on the second area, wherein each second bump is formed in a step-shape and has a first layer and a second layer from top to bottom, a size of the first layer differs from a size of the second layer, and the first layer has a second surface departed away from the chip;

an encapsulation encapsulating the chip, the first bumps and the second bumps, wherein the first surfaces of the first bumps, the second surfaces of the second bumps and a third surface are coplanar to form a flat plane; and a redistribution layer formed on the flat plane and electrically connected to the first bumps.

Based on the foregoing description, the second bumps are formed on the second area surrounding the first area and formed in a step-shape. In a grinding step, a current grinding depth of the encapsulation is determined to be proper when the second layers of the second bumps are exposed. At the time, all of the first bumps are also exposed and most part of each of the first bumps can be remained to electrically connect to the redistribution layer. No shallow-grinding or over-grinding condition occurs. In addition, a plurality of sidewalls of the chip are encapsulated, so a sidewall crack of the chip is avoided while picking up the semiconductor package.

To achieve the objective as mentioned above, the fabricating method of the semiconductor package having steps of:

(a) providing a wafer having a plurality of chip areas, wherein each of the chip areas has an active surface having a first area and a second area, and a plurality of pads are formed on each of the first areas;

(b) forming a first bump on each of the pads on each of the first areas and forming a plurality of second bumps on each of the second areas, wherein each second bump is formed in a step-shape and has a first layer, a second layer and a third layer from top to bottom;

(c) cutting a plurality of boundaries among the chip areas to form a plurality of chips;

(d) providing a carrier, on which the chips are attached, wherein the active surfaces of the chips departed away from the carrier;

(e) forming an encapsulation on the carrier to encapsulate the chips, the first bumps on the chips and the second bumps on the chips; and (f) grinding the encapsulation until the first layers of the second bumps are removed to expose the second layers of the second bumps and the first bumps, and at the time, a ground surface of the encapsulation, a plurality of exposed surfaces of the first bumps and a plurality of exposed surfaces of the second layers of the second bumps are formed to a flat plane.

Based on the foregoing description, the first bumps are formed on each first area and the second bumps are formed on each second area. Each second bump has the first to third layers from top to bottom. In a grinding step, a current grinding depth of the encapsulation is determined to be proper when the first layers of the second bumps are removed to expose the second layers of the second bumps. At the time, all of the first bumps are also completely exposed. Since the third layers of the second bumps still remain, the first bumps are not over ground.

Other objectives, advantages and novel features of the invention will become more apparent from the following detailed description when taken in conjunction with the accompanying drawings.

DETAILED DESCRIPTION OF THE EMBODIMENTS

The present invention provides a semiconductor package comprising plurality of bumps and fabricating method thereof. With embodiments and drawings thereof, the features of the present invention are described in detail as follow.

Figure 1A:
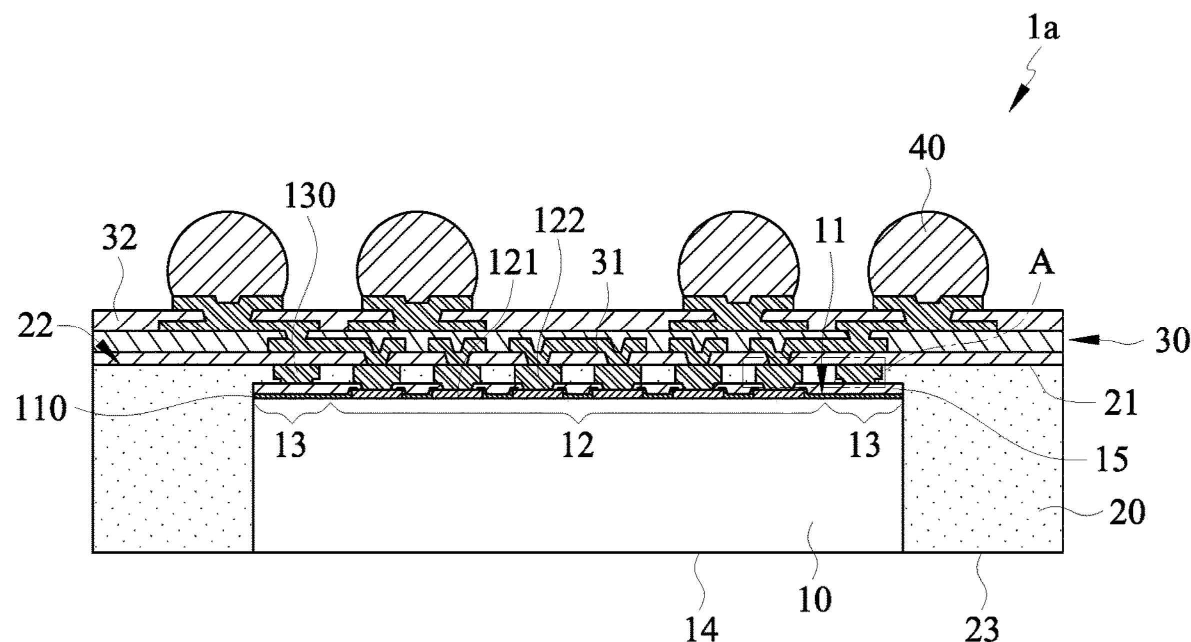
FIG. 1A is a cross sectional view of a first embodiment of a semiconductor package in accordance with the present invention.

With reference to FIG. 1A, a first embodiment of a semiconductor package of the present invention is shown. The semiconductor package 1*a* has a chip 10, a plurality of first bumps 122, a plurality of second bumps 130, an encapsulation 20 and a redistribution layer 30. The first bump 122 and the second bumps 130 are formed on the chip 10 and encapsulated by the encapsulation 20. The redistribution layer 30 is formed on the encapsulation 20.

The chip 10 has an active surface 11 and a rear surface 14. The active surface 11 further has a first area 12 and a second area 13. In the present embodiment, the second area 13 surrounds the first area 12. A plurality of pads 121 are formed on the first area 12. A dielectric layer 15 is formed on the active surface 11 to cover the pads 121 partially, so a part of each pad 121 is exposed from the dielectric layer 15. In another embodiment, a passivation layer 110 is firstly formed on the first area 12 and the second area 13 before forming the dielectric layer 15. A plurality of openings corresponding to the pads 121 are formed through the passivation layer 110 to expose the pads 121. The passivation layer 110 partially covers each of the pads 121. Then, the dielectric layer 15 is formed on the passivation layer 110 and partially covers each of the pads 121.

Figure 1B:
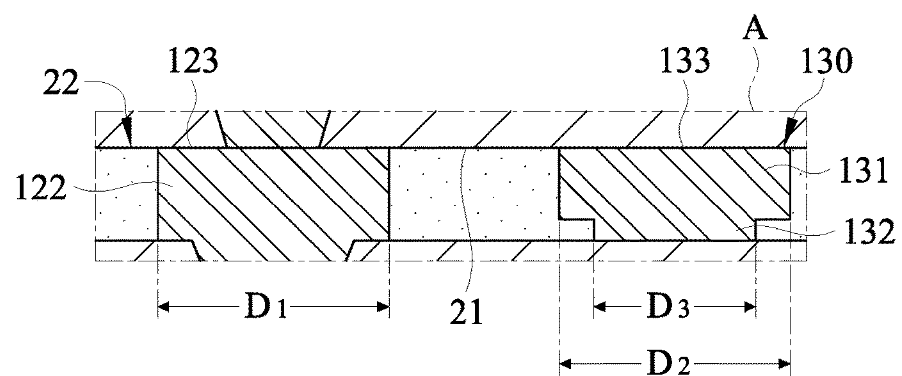
FIG. 1B is a partial enlarge view of FIG. 1A.

The first bumps 122 are respectively formed on the pads 121. In the present embodiment, as shown in FIG. 1B, each of the first bumps 122 has a first surface 123 departed away from the chip 10 and has a width D1.

The second bumps 130 are formed on the second area 13 of the active surface 11 of the chip 10. In the present embodiment, as shown in FIG. 1B, each of the second bumps 130 is formed in a step-shape and has a first layer 131 and a second layer 132 from top to bottom. The first layer 131 has a second surface 133 departed away from the chip 10 and has a width D2. The second layer 132 has a width D3. The width D2 of the first layer 131 differs from the width D3 of the second layer 132. Preferably, the width D2 of the first layer 131 is larger than the width D3 of the second layer 132. The width D1 of the first bump 122 is substantially equal to the width D2 of the first layer 131 of the second bump 130.

The encapsulation 20 encapsulates the chip 10, the first bumps 122 and the second bumps 130. The encapsulation 20 has a third surface 21 and a fourth surface 23. In one embodiment, as shown in FIG. 1B, the third surface 21 of the encapsulation 20, the first surface 123 of the first bump 122 and the second surface 133 of the second bump 130 are coplanar to form a first flat plane 22. The fourth surface 23 of the encapsulation 20 and the rear surface 14 of the chip 10 are coplanar, so the rear surface 14 of the chip 10 is exposed.

The redistribution layer 30 is formed on the first flat plane 22 and has at least one metal wiring layer 31 and a plurality of dielectric layers 32. In the present embodiment, as shown in FIG. 1A, the metal wiring layer 31 of the redistribution layer 30 is electrically connected to the first bumps 122. A plurality of solder balls 40 are mounted on the metal wiring layer 31. In one embodiment, the redistribution layer 30 is a fan-out redistribution layer so a layout area of the metal wiring layer of the redistribution layer 30 is larger than the active surface 11 of the chip 10, and a mounting area of the solder balls 40 is larger than the active surface 11.

Figure 2A:
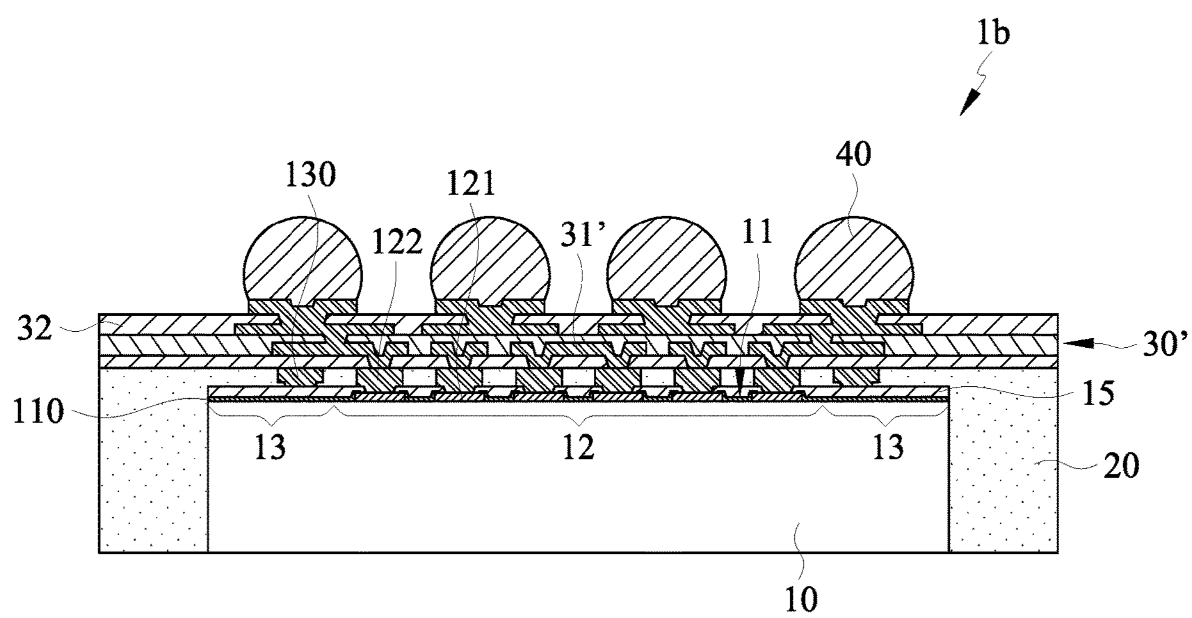
FIG. 2A is a cross sectional view of a second embodiment of a semiconductor package in accordance with the present invention.

With reference to FIG. 2A, a second embodiment of a semiconductor package 1*b* of the present invention is shown and is similar to the first embodiment of the semiconductor package 1*a* as shown in FIG. 1A, but a redistribution layer 30' of the second embodiment differs from that of the first embodiment. In the present embodiment, the redistribution layer 30' is a fan-in redistribution layer and a layout area of a metal wiring layer 31' of the redistribution layer 31' is not larger than the active surface 11 of the chip 10.

According to the first and second embodiments as mentioned above, the first bumps 122 are formed on the first area 12 of the active surface 11 and the second bumps 130 are formed on the second area 13 of the active surface 11. As shown in FIG. 1B, the width D2 of the first layer 131 of the second bump 130 is larger than the width D3 of the second layer 132 of the second bump 130, and the width D1 of the first bump 122 is substantially equal to the width D2 of the first layer 131. In a grinding step, a proper grinding depth of the encapsulation 20 is determined by checking the width of an exposed surface 133 of the second bump 130 exposed from the encapsulation 20. The proper grinding depth means that all of the first bumps 122 are completely exposed from the encapsulation 20 to electrically connect to the redistribution layer 30, 30'. A shallow-grinding or over-grinding does not occur. In addition, a plurality of sidewalls of the chip 10 are encapsulated so the sidewall crack of the chips 10 is avoided while picking up the semiconductor package 1*a*, 1*b*.

Figure 2B:
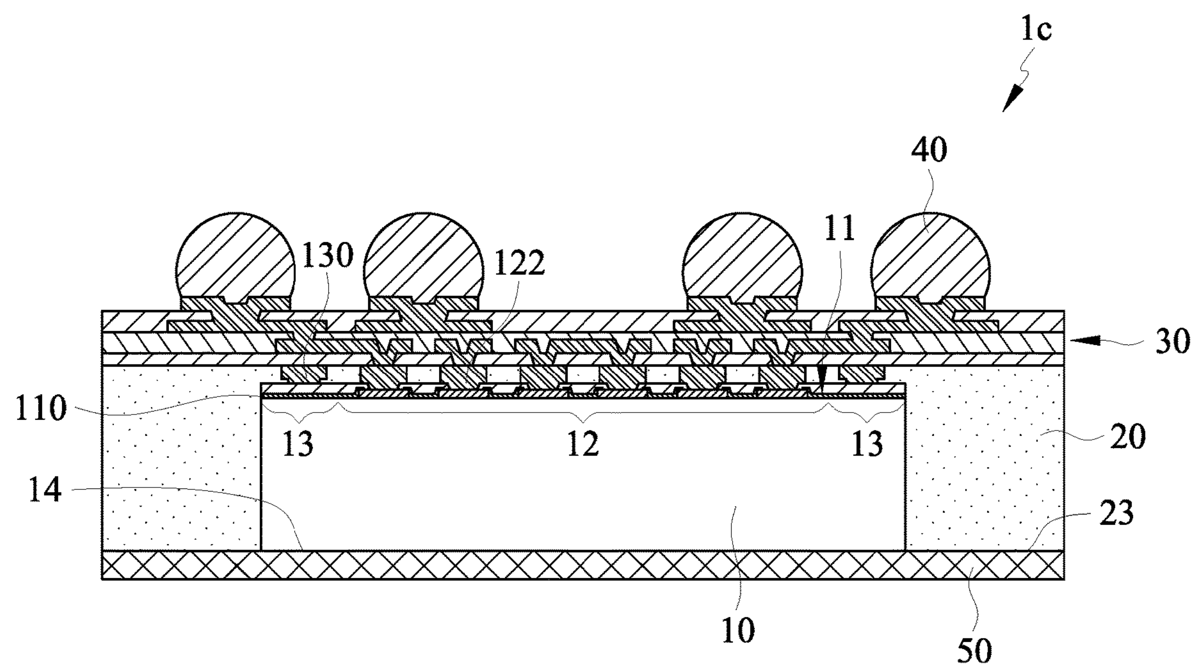
FIG. 2B is a cross sectional view of a third embodiment of a semiconductor package in accordance with the present invention.

With reference to FIG. 2B, a third embodiment of a semiconductor package 1*c* of the present invention is shown and is similar to the first embodiment of the semiconductor package 1*a* of FIG. 1A, but the third embodiment of the semiconductor package 1*c* further has a protection layer 50 formed on the fourth surface 23 of the encapsulation 20 and the rear surface 14 of the chip 10.

As mentioned above, the protection layer 50 formed on the fourth surface 23 of the encapsulation 20 and the rear surface 14 of the chip 10 to prevent the rear surface 23 of the chip 10 from scratching.

Figure 2C:
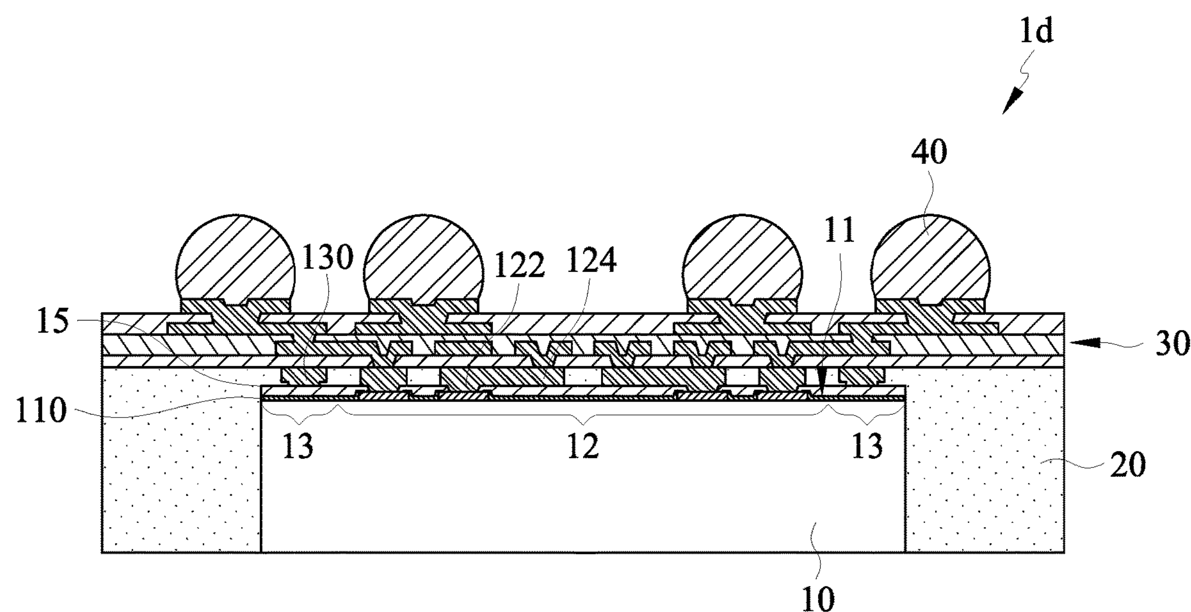
FIG. 2C is a cross sectional view of a fourth embodiment of a semiconductor package in accordance with the present invention.

With reference to FIG. 2C, a fourth embodiment of a semiconductor package 1*d* of the present invention is similar to the first embodiment of the semiconductor package 1*a* of FIG. 1A, but the fourth embodiment of the semiconductor package 1*d* further has another metal wiring layer 124 formed on the first area 12. The metal wiring layer 124 is electrically connected to the first bumps 122 on the first area 12.

As mentioned above, the metal wiring layer 124 is formed on the first area 12 to electrically connect to the first bumps 122 to simplify a layout design of the metal wiring layer 31 of the redistribution layer 30 or further reduce an amount of layers of the redistribution layer 30.

The structure of the semiconductor package of the present invention is described above and a fabricating method of the semiconductor package is further described as follows.

With reference to FIGS. 3A to 3D and FIGS. 5A to 5G, one embodiment of the fabricating method of the semiconductor package has following steps of (a) to (j). In the FIGS. 3A to 3D, a wafer bumping procedure is a front-end procedure of the fabricating method and corresponds to the steps of (a) to (c) of the fabricating method. In FIGS. 5A to 5G, a packaging procedure is a rear-end procedure of the fabricating method and corresponds to the steps of (d) to (j) of the fabricating method.

Figure 3A:
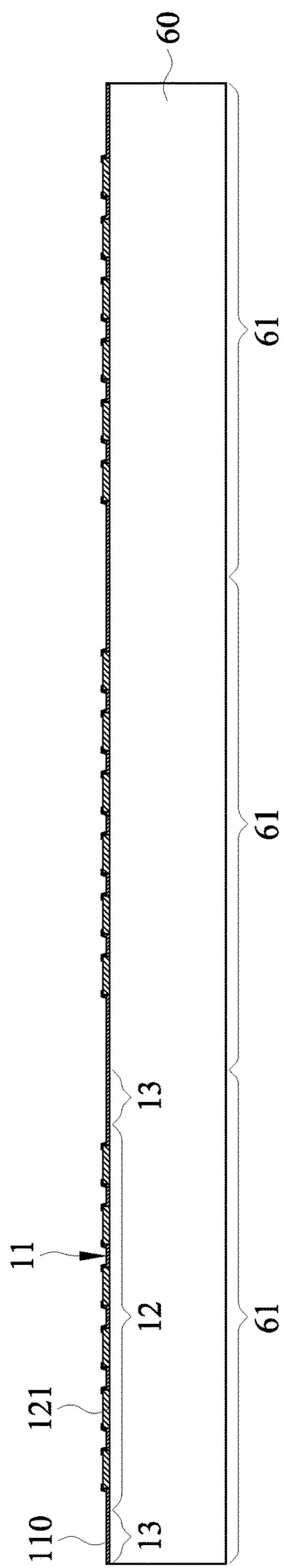
FIGS. 3A to 3D are cross sectional views in different steps of bumping procedure of a fabricating method of a semiconductor package in accordance with the present invention.

In step (a), as shown in FIG. 3A, a wafer 60 is provided. The wafer 60 has a plurality of chip areas 61. Each chip area 61 has an active surface 11. The active surface 11 has a first area 12 and a second area 13. A plurality of pads 121 are formed on the first area 12. A passivation layer 110 is formed on the first areas 12 and second areas 13. A plurality of openings corresponding to the pads 121 are formed through the passivation layer 110 to expose the pads 121. In the present embodiment, the passivation layer 110 partially covers each of the pads 121.

Figure 3B:
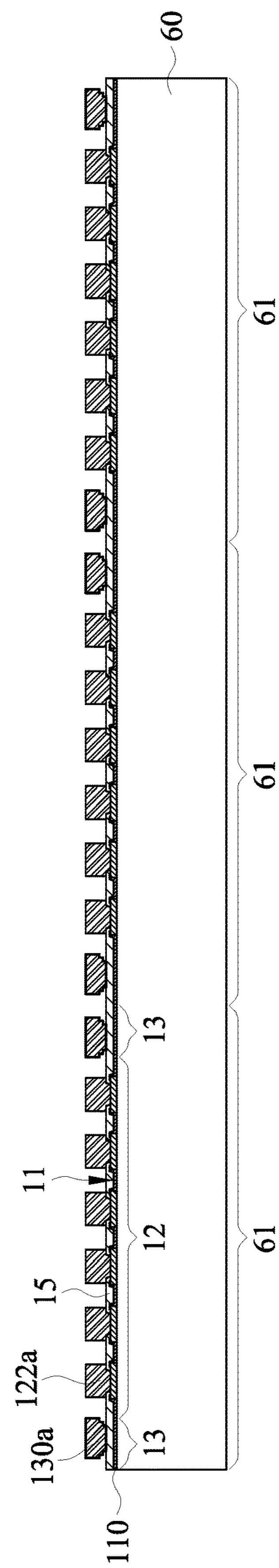
Figure 4A:
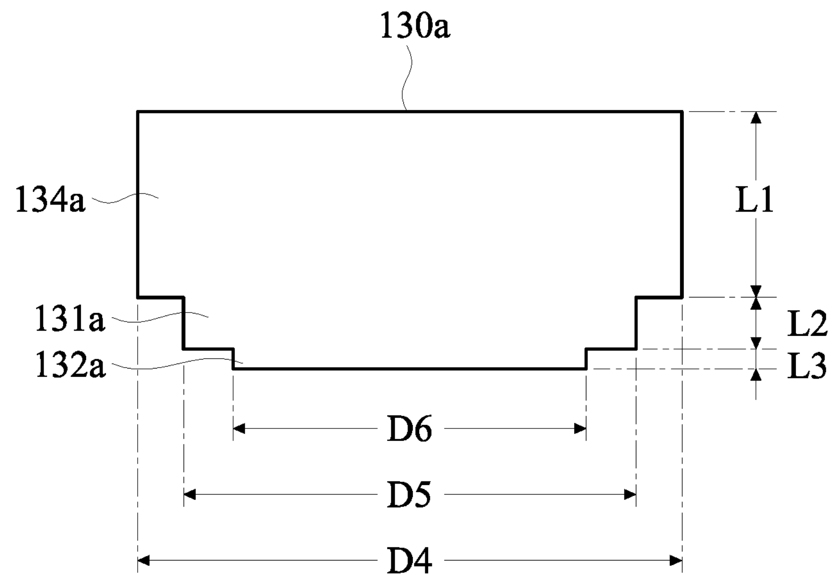
FIG. 4A is a side view of a second bump formed in a first embodiment of the fabricating method of a semiconductor package in accordance with the present invention.
Figure 4B:
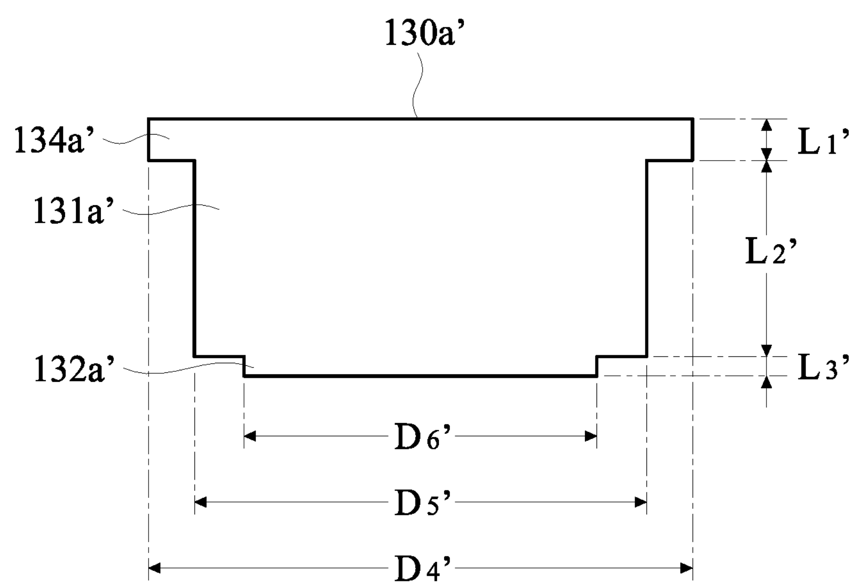
FIG. 4B is a side view of a second bump formed in a second embodiment of the fabricating method of a semiconductor package in accordance with the present invention.

In the step (b), as shown in FIG. 3B, a dielectric layer 15 is formed on the passivation layers 110 of the chip areas 61 to cover each of the pads 121 partially, so a part of each of the pads 121 are exposed from the dielectric layer 15. And then, a first bump 122*a* is formed on each of the pads 121 and a plurality of second bumps 130*a* are formed on the dielectric layer 15 corresponding to the second areas 13. In the present embodiment, as shown in FIG. 4A, each of the second bumps 130*a* is formed as a step-shaped bump and has a first layer 134*a*, a second layer 131*a* and a third layer 132*a* from top to bottom. The first layer 134*a* has a width D4 and a thickness L1. The second layer 131*a* has a width D5 and a thickness L2. The third layer 132*a* has a width D6 and a thickness L3. The widths D4, D5, D6 of the first to third layer 134*a*, 131*a*, 132*a* are different. The thicknesses L1, L2, L3 of the first to third layer 134*a*, 131*a*, 132*a* are different. Preferably, the width D4 of the first layer 134*a* is larger than the width D5 of the second layer 131*a* and the width D5 of the second layer 131*a* is larger than the width D6 of the third layer 132*a*. The thickness L1 of the first layer 134*a* is larger than the thickness L2 of the second layer 131*a*. The thickness L2 of the second layer 131*a* is larger the thickness L3 of the third layer 132*a*. In another embodiment, as shown in FIG. 4B, a second bump 130*a'* is similar to the second bump 130*a* of FIG. 4A, but a thickness L1' of a first layer 134*a'* differs from the thickness L1 of the first layer 134*a* of FIG. 4A, a thickness L2' of a second layer 131*a'* differs from the thickness L2 of the second layer 131*a* of FIG. 4A, and the thickness L1' of the first layer 134*a'* is less than the thickness L2' of the second layer 131*a'*. In another embodiment, as shown in FIG. 2C, during forming the first and second bumps 122, 130, a metal wiring layer 124 may be further formed on each of the first areas 12 of the chip areas 61. The metal wiring layer 124 on the dielectric layer 15 corresponding to the first area 12 are electrically connected to the first bumps 122 on the same first area 12.

Figure 3C:
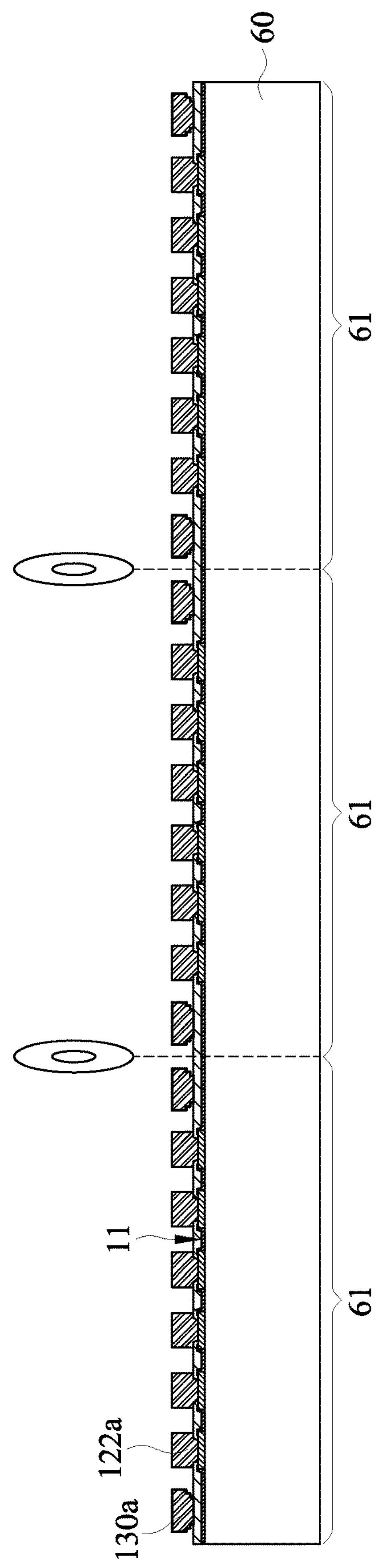
Figure 3D:
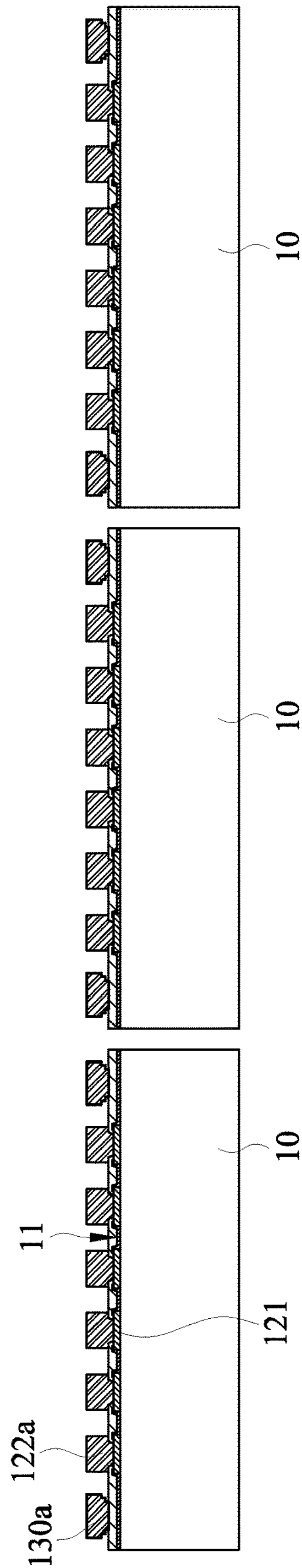

In the step (c), as shown in FIG. 3C, the wafer 60 is cut along a plurality of boundaries among the chip areas 61 to form a plurality of chips 10 as shown in FIG. 3D.

Figure 5A:
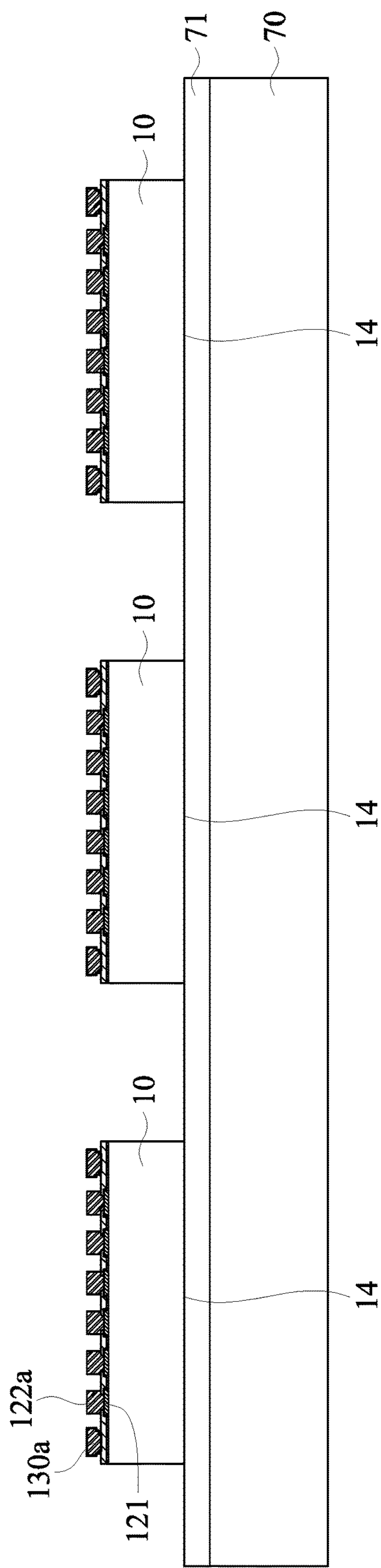
FIGS. 5A to 5G are cross sectional views in different steps of a fabricating method of a semiconductor package in accordance with the present invention.

In the step (d), as shown in FIG. 5A, a carrier 70 is provided and the chips 10 are attached on the carrier 70. In the present embodiment, the chips 10 attached on the carrier 70 through an interposed layer 71. The interposed layer 71 may be an adhesive layer or a release layer.

Figure 5B:
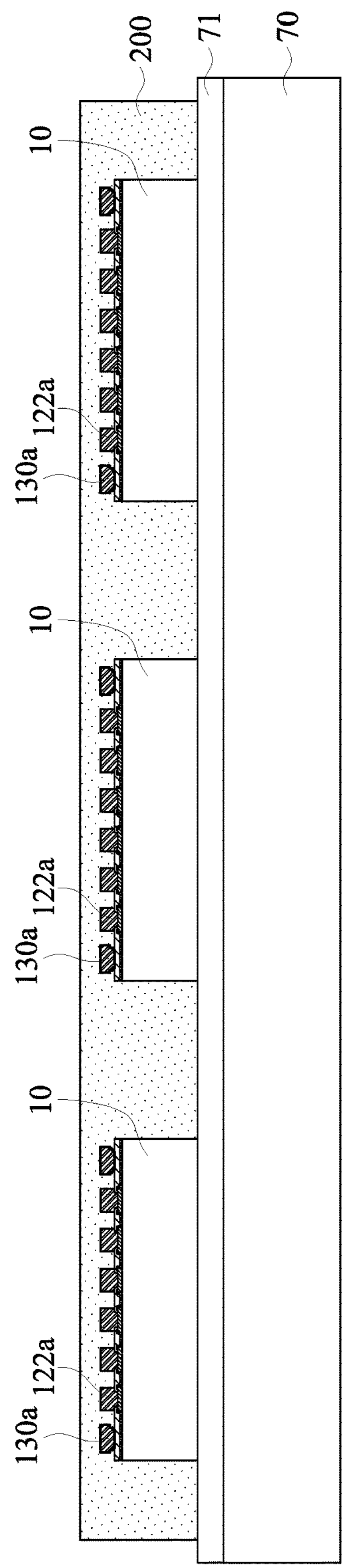
Figure 6A:
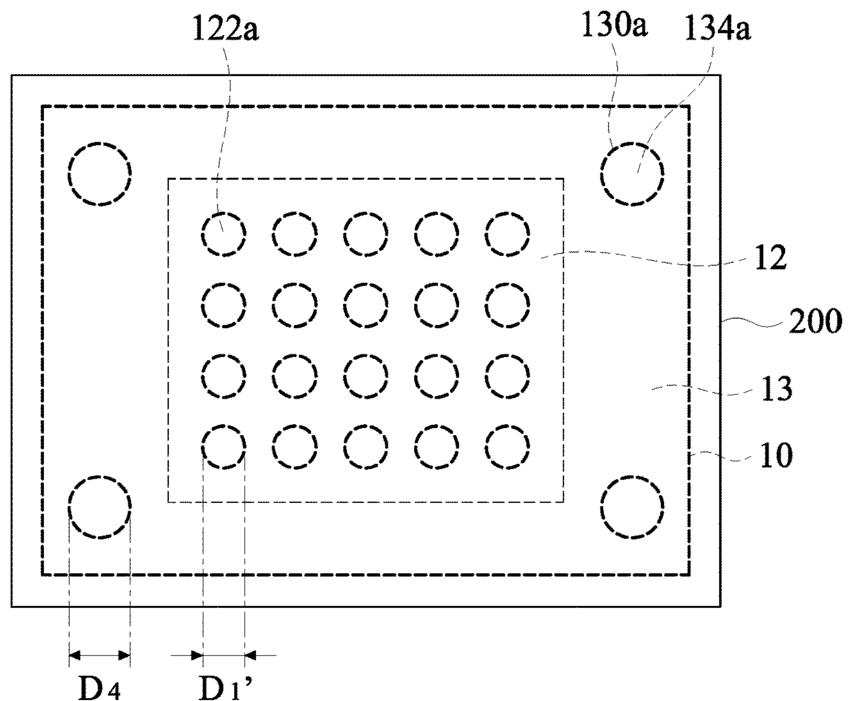
FIG. 6A is a top view of one encapsulated chip of FIG. 5B.

In the step (e), as shown in FIG. 5B, an encapsulation 200 is formed on the carrier 70 to encapsulate the chips 10, the first bumps 122*a* on the chips 10 and the second bumps 130*a* on the chips 10. In the present embodiment, with further reference to FIG. 6A, at least two second bumps 130*a* are respectively formed on two diagonal corners of the second area 13. The width D4 of the first layer 134*a* of the second bump 130*a* is larger than the width D1' of the first bump 122*a*. Each of the first and second bumps 122*a*, 130*a* are formed as a pillar and more particularly to be formed as a cylinder, but not limited to. In one embodiment, the second bumps 130*a* are respectively formed on four corners of the second area 13.

Figure 5C:
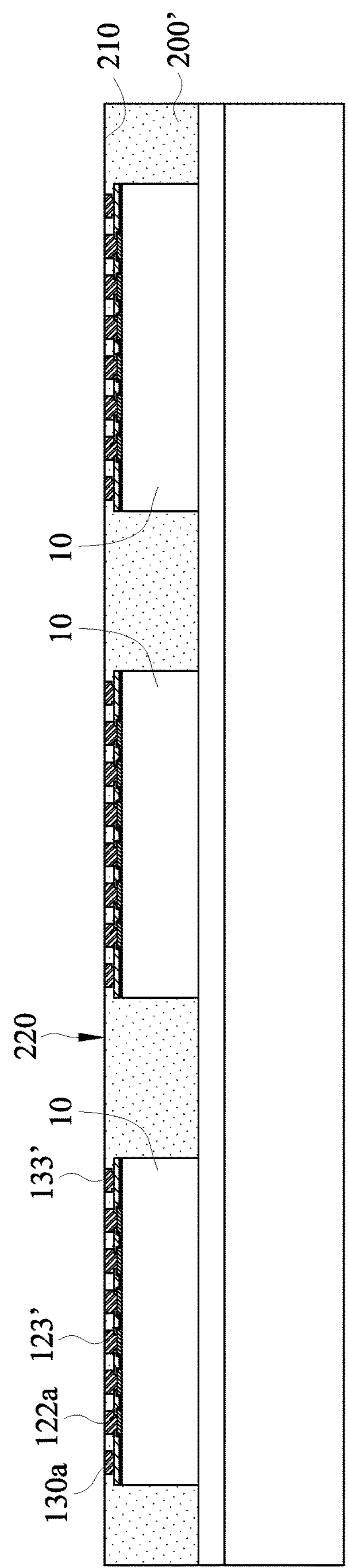
Figure 6B:
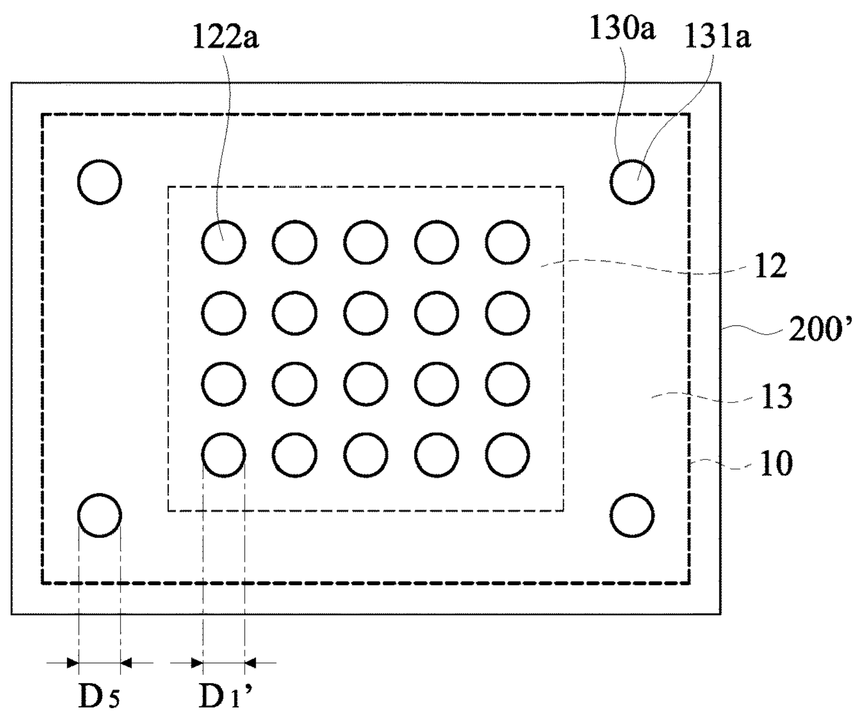
FIG. 6B is a top view of one encapsulated chip of FIG. 5C.

In the step (f), as shown in FIGS. 4A, 5B and 5C, the encapsulation of FIG. 5B is ground until the first layer 134*a* of each of the second bumps 130*a* are removed and the second layer 131*a* of the second bumps 130*a* and each of the first bumps 122*a* are exposed. Therefore, a thickness of the encapsulation 200' of FIG. 5C is thinner than that of the encapsulation 200 of FIG. 5B. In the present embodiment, a surface 210 of the encapsulation 200', the exposed surfaces 123' of the first bumps 122*a* and the exposed surfaces 133' of the second bumps 130*a* are formed as a flat plane 220. As shown in FIG. 6B, the width D5 of the second layer 131*a* of the second bumps 130*a* is substantially equal to the width D1' of the first bump 122*a*. In one embodiment, a grinding depth is larger than the thickness L1 of the first layer 134*a* of each second bump 130*a* and less than a sum of the thickness L1 of the first layer 134*a* and the thickness L2 of the second layer 131*a*. Therefore, a stop line of grinding is preset as any one of heights of the second layer 131*a* of the second bump 130*a*.

Figure 7A:
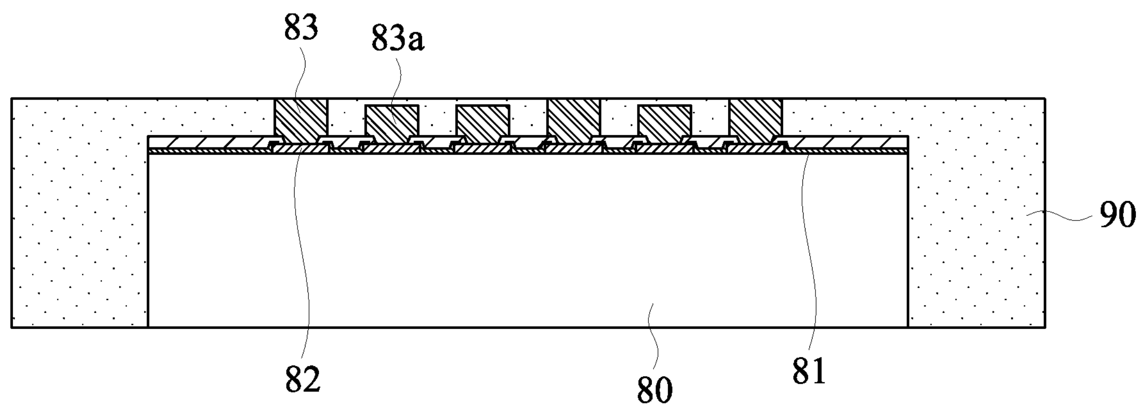
FIGS. 7A and 7B are cross sectional views of a conventional semiconductor package in accordance with the prior art.
Figure 7B:
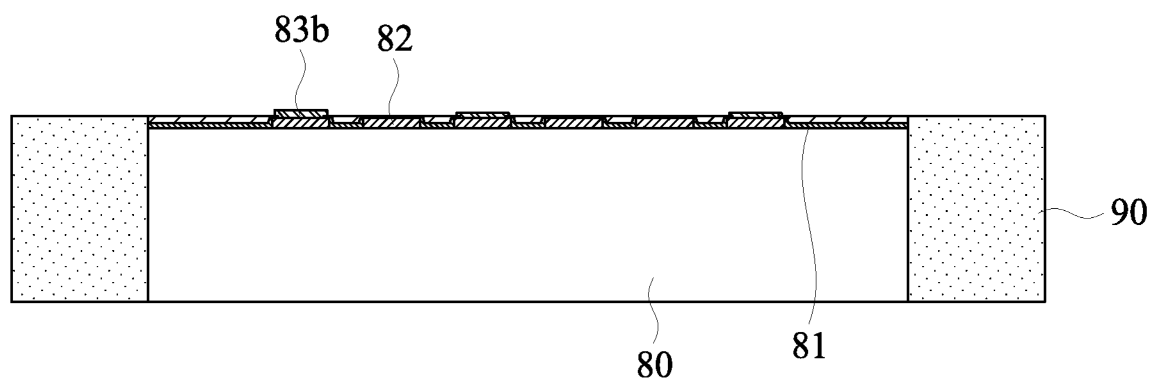

During grinding of a grinding equipment, the grinding equipment monitors size changes of the surface of the second bump 130*a* exposed from the encapsulation 200'. With further reference to FIG. 4A, when the grinding equipment monitors that a width of the exposed surface of the second bump 130*a* is equal to the width D4, the grinding equipment determines that the encapsulation 200' is shallow ground, as shown in FIG. 7A. When the grinding equipment monitors that a width of the exposed surface of the second bump 130*a* is equal to the width D5, the grinding equipment determines that the grinding depth is proper and all of the first bumps 122*a* should be exposed from the encapsulation 200'. When the grinding equipment monitors that a width of the exposed surface of the second bump 130*a* is equal to the width D6, the grinding equipment determines that the encapsulation 200' is over ground and a thickness of the first bump is too thin or even dissipated, as shown FIG. 7B.

Figure 5D:
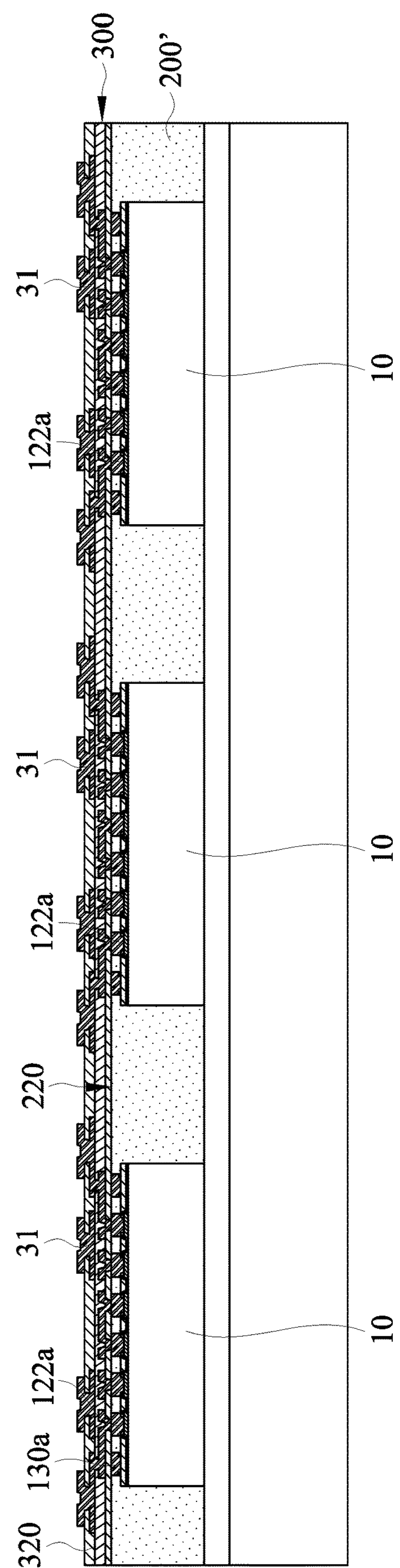

In the step (g) of FIG. 5D, a redistribution layer 300 is formed on the flat plane 220. The redistribution layer 300 has a plurality of metal wiring layers 31 and a plurality of dielectric layers 320. In the present embodiment, the redistribution layer 300 is a 3P3M structure. The metal wiring layers 31 are electrically connected to the first bumps 122*a* of each chip 10. In the present embodiment, the redistribution layer 300 is a fan-out redistribution layer. In one embodiment, the redistribution layer 300 may be a fan-in redistribution layer.

Figure 5E:
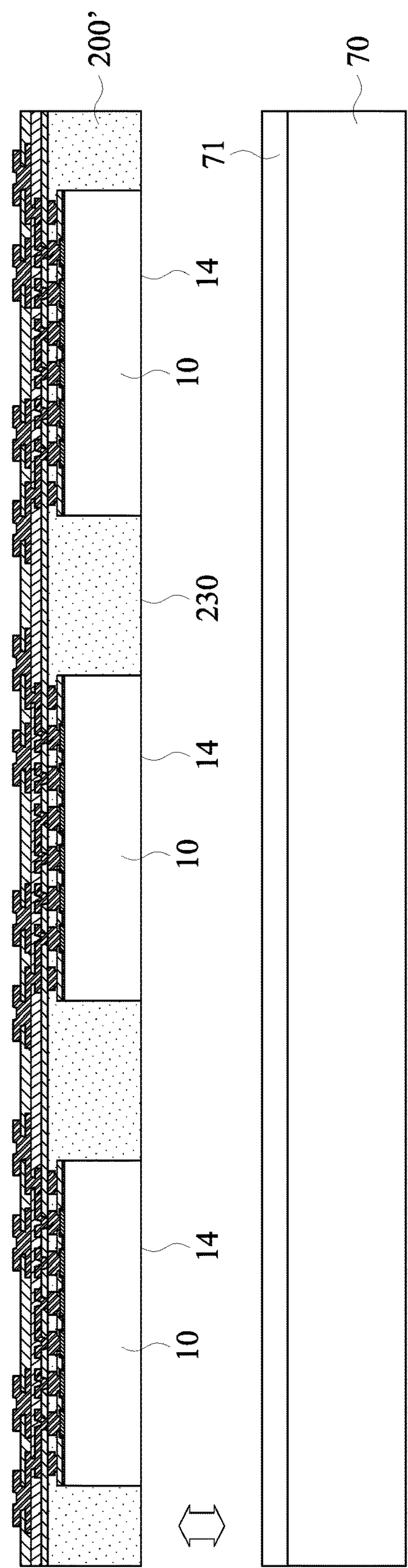

In the step (h) of FIG. 5E, the carrier 70 is removed, so the rear surface 14 of each chip 10 and a bottom surface 230 of the encapsulation 200' are exposed. In the present embodiment, a protection layer 50 of FIG. 2 is further formed on the rear surface 14 of each chip 10 and the bottom surface 230 of the encapsulation 200'.

Figure 5F:
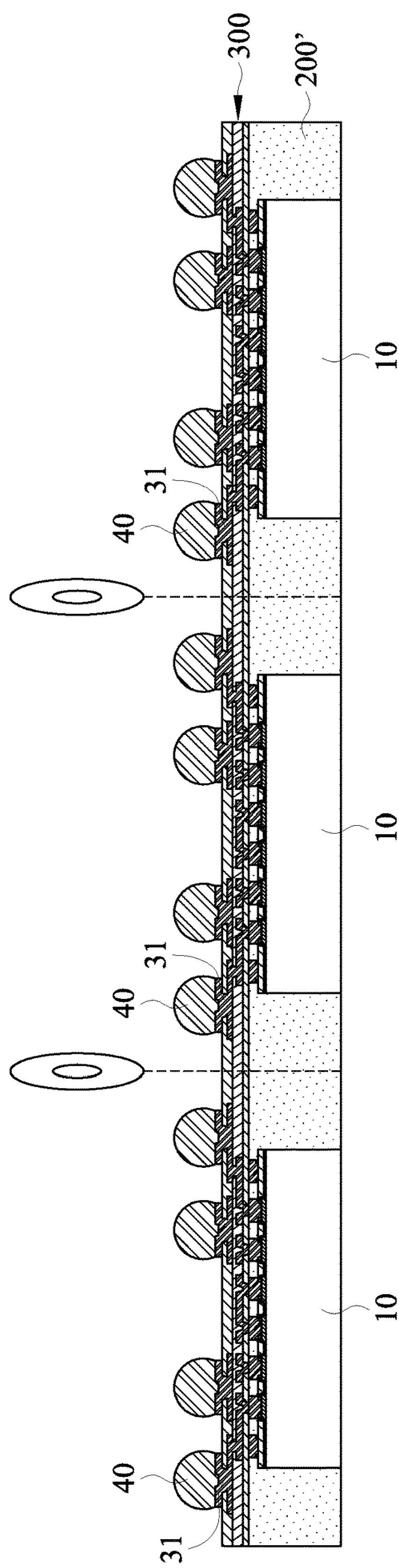

In the step (i) of FIG. 5F, a plurality of solder balls 40 are formed on the metal wiring layer 31 of the redistribution layer 300.

Figure 5G:
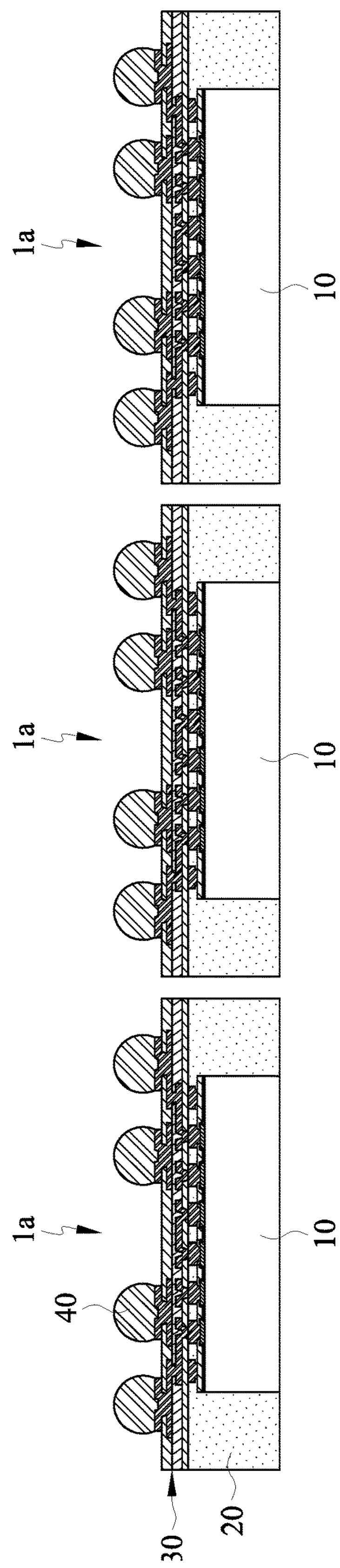

In the step (j) of FIGS. 5F and 5G, the redistribution layer 300 and the encapsulation 200' are cut to form a plurality of the semiconductor package 1*a* of FIG. 1A.

As mentioned above, in the fabricating method of the semiconductor package of the present invention, the first bumps 122*a* are formed on the first area 12 of the active surface 11 of each chip area 61 and the second bumps 130*a* are formed on the second area 13 of the active surface 11 of each chip area 61. Each of the second bumps 130*a* has a first to third layers 134*a*, 131*a* 132*a* from top to bottom. Sizes of the first to third layers 134*a*, 131*a* 132*a* are different. During grinding the encapsulation 200, the thickness of the encapsulation 200 is decreased to a thickness of the ground encapsulation 200' and the grinding step should be stopped by the grinding depth is determined to be proper according to size changes of the surface of the second bump 130*a* exposed from the encapsulation 200'. When the proper grinding depth is determined, all of the first bumps 122*a* are exposed from the encapsulation 200' to electrically connect to the redistribution layer 300. A shallow-grinding or over-grinding does not occur. At the time, the encapsulation 200' also encapsulates the sidewalls of each chip 10. After the semiconductor package is formed by cutting the encapsulation 200', the encapsulation 20 can prevent the chip from cracking while picking up the semiconductor package. In addition, the protection layer on the rear surface of the chip prevents the rear surface of the chip from scratching. After the first bumps 122*a* are formed, the metal wiring layer 124 is further formed on the first area of each first area 12 to electrically connect to the first bumps 122*a*. In another embodiment, the first bumps 122*a* and the wiring layer 124 may formed at the same process, so a thickness of each first bump 122*a* is the same as that of the wiring layer 124. Therefore, the redistribution layer 300 may simplify the layout of wirings and even reduce an amount of layers thereof.

Based on the foregoing description, the semiconductor package has a plurality of first and second bumps. The first bumps are formed on each pad and each second bump has different layers from top to bottom. In a grinding step, a current grinding depth of the encapsulation is determined to be proper according to the size changes of the surface of the second bump exposed from the encapsulation. All of the first bumps are exposed from the encapsulation when the proper grinding depth is determined to prevent the shallow-grinding or over-grinding. The sidewalls of the chip of the semiconductor package is also encapsulated by the encapsulation, the encapsulation 20 can prevent the chip from cracking while picking up the semiconductor package. The protection layer formed on the rear surface of the chip and the fourth surface of the encapsulation enhances the rear surface of the chip to prevent the rear surface of the chip from scratching. After the first bumps 122*a* are formed, the metal wiring layer 124 is further formed on the first area of each first area 12 to electrically connect to the first bumps 122*a*. Therefore, the redistribution layer 300 may simplify the layout of wirings and even reduce an amount of layers thereof.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A semiconductor package, comprising:

a chip having a plurality of pads and an active surface having a pad area and a pad-free area, wherein the pad-free area surrounds the pad area, the plurality of pads that are formed on the pad area; no pad is formed on the pad-free area;

a plurality of first bumps respectively formed on the plurality of pads on the pad area, wherein each of the plurality of first bumps has a first surface departed away from a corresponding pad;

a plurality of second bumps formed on the pad-free area, wherein each of the plurality of second bumps is formed in a step-shape and has a first layer and a second layer from top to bottom, a size of the first layer differs from a size of the second layer, and the first layer has a second surface departed away from the chip;

an encapsulation encapsulating the chip, the plurality of first bumps and the plurality of second bumps, wherein the first surface of each of the plurality of first bumps, the second surface of each of the plurality of second bumps and a third surface of the encapsulation are coplanar to form a flat plane; and a redistribution layer formed on the flat plane and electrically connected to the plurality of first bumps.

2. The semiconductor package as claimed in claim 1, wherein a width of the first layer of each of the plurality of second bumps is substantially equal to a width of the first bump.

3. The semiconductor package as claimed in claim 1, wherein a width of the first layer of each of the plurality of second bumps is larger than a width of the second layer.

4. The semiconductor package as claimed in claim 2, wherein the width of the first layer of each of the plurality of second bumps is larger than a width of the second layer.

5. The semiconductor package as claimed in claim 3, wherein the encapsulation further has a fourth surface opposite to the third surface and the fourth surface and a rear surface of the chip is coplanar.

6. The semiconductor package as claimed in claim 4, wherein the encapsulation further has a fourth surface opposite to the third surface and the fourth surface and a rear surface of the chip are coplanar.

7. The semiconductor package as claimed in claim 5, wherein the redistribution layer is a fan-out redistribution layer or a fan-in redistribution layer.

8. The semiconductor package as claimed in claim 5, further comprising a protection layer formed on the fourth surface of the encapsulation and the rear surface of the chip.

9. The semiconductor package as claimed in claim 6, further comprising a protection layer formed on the fourth surface of the encapsulation and the rear surface of the chip.

10. The semiconductor package as claimed in claim 5, further comprising a metal wiring layer formed on the pad area and electrically connected to the plurality of first bumps.

11. The semiconductor package as claimed in claim 6, further comprising a metal wiring layer formed on the pad area and electrically connected to the plurality of first bumps.

* * * * *